(12) United States Patent
Corliss et al.

(10) Patent No.: US 10,921,715 B2
(45) Date of Patent: Feb. 16, 2021

(54) SEMICONDUCTOR STRUCTURE FOR OPTICAL VALIDATION

(71) Applicant: INTERNATIONAL BUSINESS MACHINES CORPORATION, Armonk, NY (US)

(72) Inventors: Daniel Corliss, Waterford, NY (US); Derren N. Dunn, Sandy Hook, CT (US); Michael A. Guillorn, Cold Springs, NY (US); Shawn P. Fetterolf, Cornwall, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/522,753

(22) Filed: Jul. 26, 2019

(65) Prior Publication Data

US 2019/0346773 A1 Nov. 14, 2019

Related U.S. Application Data

(62) Division of application No. 15/827,561, filed on Nov. 30, 2017, now Pat. No. 10,429,743.

(51) Int. Cl.
*G03F 7/20* (2006.01)
*G03F 1/36* (2012.01)
(Continued)

(52) U.S. Cl.
CPC ............ *G03F 7/70441* (2013.01); *G03F 1/36* (2013.01); *G03F 1/38* (2013.01); *G03F 1/42* (2013.01);
(Continued)

(58) Field of Classification Search
CPC .. G03F 7/70441; G03F 7/70125; G03F 7/705; G03F 7/70683; G03F 1/144;
(Continued)

(56) References Cited

U.S. PATENT DOCUMENTS 6,047,068 A 4/2000 Rhelimi
7,241,538 B2 7/2007 Zhang
(Continued)

FOREIGN PATENT DOCUMENTS

CN 1932651 A 3/2007
CN 104317159 A 1/2015
(Continued)

OTHER PUBLICATIONS

IBM: List of IBM Patents or Patent Applications Treated as Related (Appendix P), Jul. 24, 2019, pp. 1-2.
(Continued)

*Primary Examiner* — Tu-Tu V Ho
(74) *Attorney, Agent, or Firm* — L. Jeffrey Kelly

(57) ABSTRACT

An embodiment of the invention may include a semiconductor structure for ensuring semiconductor design integrity. The semiconductor structure may include an electrical circuit necessary for the operation of the semiconductor circuit and white space having no electrical circuit. The semiconductor structure may include an optical pattern used for validating the semiconductor circuit design formed in the white space of the electrical circuit. In an embodiment of the invention, the optical pattern may include one or more deposition layers. In an embodiment of the invention, the optical pattern may include covershapes. In an embodiment of the invention, the optical pattern may be physically isolated from the electrical circuit. The optical pattern may include a Moiré pattern.

20 Claims, 4 Drawing Sheets

(51) Int. Cl.
  *G03F 1/42* (2012.01)
  *G03F 1/38* (2012.01)
  *G03F 1/70* (2012.01)
  *G06F 30/30* (2020.01)
  *G06F 30/398* (2020.01)

(52) U.S. Cl.
  CPC ............... *G03F 1/70* (2013.01); *G03F 7/705* (2013.01); *G03F 7/70125* (2013.01); *G03F 7/70683* (2013.01); *G06F 30/30* (2020.01); *G06F 30/398* (2020.01)

(58) Field of Classification Search
  CPC ..... G03F 1/36; G03F 1/38; G03F 1/42; G03F 1/70; G06F 17/5045; G06F 17/5081; G06F 30/398; G06F 30/30
  USPC .......................................................... 257/48
  See application file for complete search history.

(56) References Cited

U.S. PATENT DOCUMENTS

| | | | |
|---|---|---|---|
| 7,265,904 B2 | 9/2007 | Schilling | |
| 7,554,337 B2 | 6/2009 | Tuyls | |
| 7,780,893 B2 | 8/2010 | Sreenivasan | |
| 7,840,803 B2 | 11/2010 | Devadas | |
| 7,851,110 B2 | 12/2010 | Progler | |
| 7,880,880 B2 * | 2/2011 | Van Bilsen | G03F 9/7046 250/237 G |
| 8,351,087 B2 | 1/2013 | Amidror | |
| 8,610,454 B2 | 12/2013 | Plusquellic | |
| 2005/0095509 A1 | 5/2005 | Zhang | |
| 2006/0078807 A1 | 4/2006 | Chen | |
| 2006/0238270 A1 | 10/2006 | Rostami | |
| 2007/0016321 A1 | 1/2007 | Rathei | |
| 2007/0037394 A1 | 2/2007 | Su | |
| 2007/0074145 A1 | 3/2007 | Tanaka | |
| 2007/0148794 A1 | 6/2007 | Cha | |
| 2007/0245290 A1 | 10/2007 | Bueti | |
| 2008/0120586 A1 | 5/2008 | Hoerold | |
| 2008/0201677 A1 | 8/2008 | Baker | |
| 2009/0304181 A1 | 12/2009 | Fischer | |
| 2013/0214337 A1 * | 8/2013 | Kashihara | H01L 23/544 257/294 |
| 2016/0012174 A1 | 1/2016 | Shin | |
| 2016/0064447 A1 * | 3/2016 | Kimura | H01L 27/14641 257/292 |
| 2016/0233177 A1 | 8/2016 | Choi | |
| 2017/0081756 A1 | 3/2017 | Benvenuti | |
| 2017/0212165 A1 | 7/2017 | Bickford | |
| 2018/0196463 A1 | 7/2018 | Dusatko | |
| 2019/0163071 A1 | 5/2019 | Corliss et al. | |
| 2019/0163857 A1 | 5/2019 | Corliss et al. | |

FOREIGN PATENT DOCUMENTS

| | | |
|---|---|---|
| JP | 2007193795 A | 8/2007 |
| JP | 2008058166 A | 3/2008 |

OTHER PUBLICATIONS

Buehler et al., Abstract for "The Use of Electrical Test Structure Arrays for Integrated Circuit Process Evaluation", Journal of the Electrochemical Society, vol. 127, No. 10, pp. 2284-2290, Apr. 1980.

Markman et al., "Security authentication with a three-dimensional optical phase code using random forest classifier", Research Article, Journal of the Optical Society of America A, Optics, Image Science and Vision, vol. 33, No. 6, Jun. 2016, pp. 1160-1165.

Muldavin "Long-Term Strategy for DoD Trusted and Assured Microelectronics Needs" 19th Annual NDIA Systems Engineering Conference, Springfield, VA, Oct. 26, 2016, pp. 1-28.

Roy et al., "Ending Piracy of Integrated Circuits", Computer, published by the IEEE Computer Society, Oct. 2010, pp. 30-38.

Volodin et al., "A polymeric optical pattern-recognition system for security verification", Letters to Nature, vol. 383, Sep. 5, 1996, pp. 58-60.

International Search Report and Written Opinion, International Application No. PCT/IB2018/059222, 9 pages, dated Mar. 20, 2019.

International Search Report and Written Opinion, International Application No. PCT/IB2018/059223, 9 pages, dated Mar. 11, 2019.

* cited by examiner

SEMICONDUCTOR STRUCTURE FOR OPTICAL VALIDATION

BACKGROUND

The present invention generally relates to semiconductor mask manufacture, and particularly to optical validation of semiconductor masks.

Semiconductor photomasks are designed to define circuit patterns for the transitions and interconnect layers. The photomask design also contains white space in between and around the circuit patterns for the transitions and interconnect layers. The greater the available white space on a photomask, the greater the possibility of additional circuit elements being added to the design by a third party.

BRIEF SUMMARY

An embodiment of the invention may include a semiconductor structure. The semiconductor structure may include an electrical circuit necessary for the operation of the semiconductor circuit. The semiconductor structure may include white space, which may have no electrical circuit. The semiconductor structure may include an optical pattern formed in the white space of the electrical circuit for validating the semiconductor circuit design. In an embodiment of the invention, the optical pattern may include one or more deposition layers. In an embodiment of the invention, the optical pattern may include covershapes. In an embodiment of the invention, the optical pattern may be physically isolated from the electrical circuit. The optical pattern may include a Moiré pattern.

BRIEF DESCRIPTION OF THE DRAWINGS

The following detailed description, given by way of example and not intended to limit the invention solely thereto, will best be appreciated in conjunction with the accompanying drawings, in which.

Figure 1:
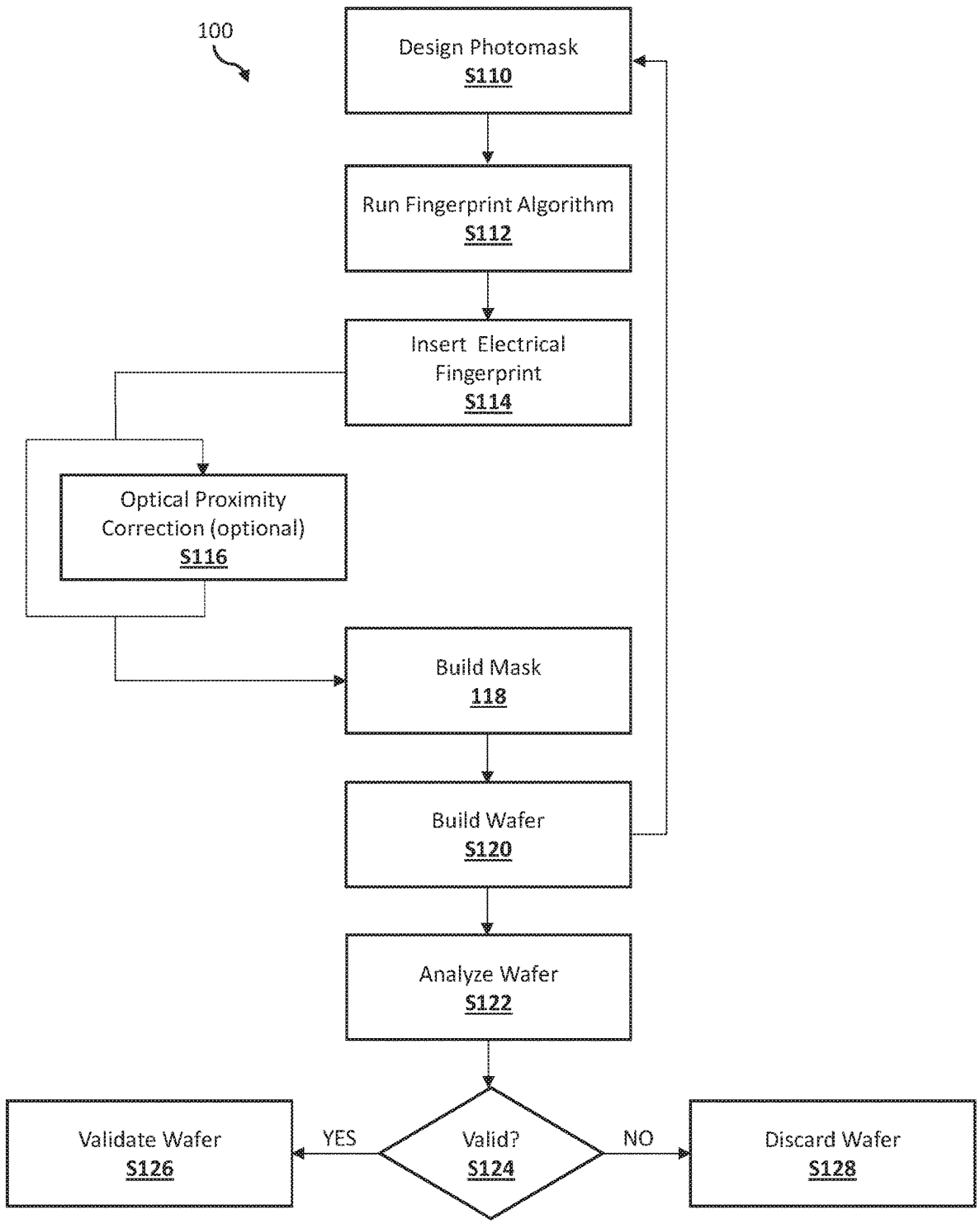
FIG. 1 is a flow chart of a method for optically validating the correct mask was used during semiconductor manufacture, according to an embodiment of the present invention.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the invention generally relate to methods of optically validating the usage of a photomask in semiconductor manufacture. Semiconductor photomasks define the circuit patterns for the transitions and interconnect layers. Photomasks also contain white space in between and around the circuit patterns for the transitions and interconnect layers which allow for the possibility of unwanted additional circuit elements being added by a third party. The present invention uses an algorithm to analyze the available white space on a photomask and designs an optical pattern to be inserted on the photomask to consume the white space. The optical pattern may be viewed under a microscope and/or using a light source. Thus, the present invention prevents the addition of unwanted circuit elements into the design for a semiconductor by providing an optically viewable pattern to occupy the white space in a photomask design.

Embodiments of the present invention will now be described in detail with reference to the accompanying Figures.

FIG. 1 is a flow chart of a method for optically validating the correct mask was used during semiconductor manufacture, according to an embodiment of the present invention. Referring to FIG. 1, the method 100 includes a step 110, designing a photomask; a step 112, running a fingerprint algorithm; a step 114, inserting an optical fingerprint in the white space of the photomask; a step 116, enhancing the photomask using optical proximity correction; a step 118, building a mask; a step 120, building a wafer; a step 122, testing the optical patterns of the wafer; a step 124, comparing the optical patterns of the wafer to known optical patterns of the optical fingerprint design; a step 126, validating the wafer when the optical patterns match; and a step 128, discarding the wafer when the optical patterns do not match. Steps of the method 100 embodied in FIG. 1 are depicted in FIGS. 2a-f.

Figure 2A:
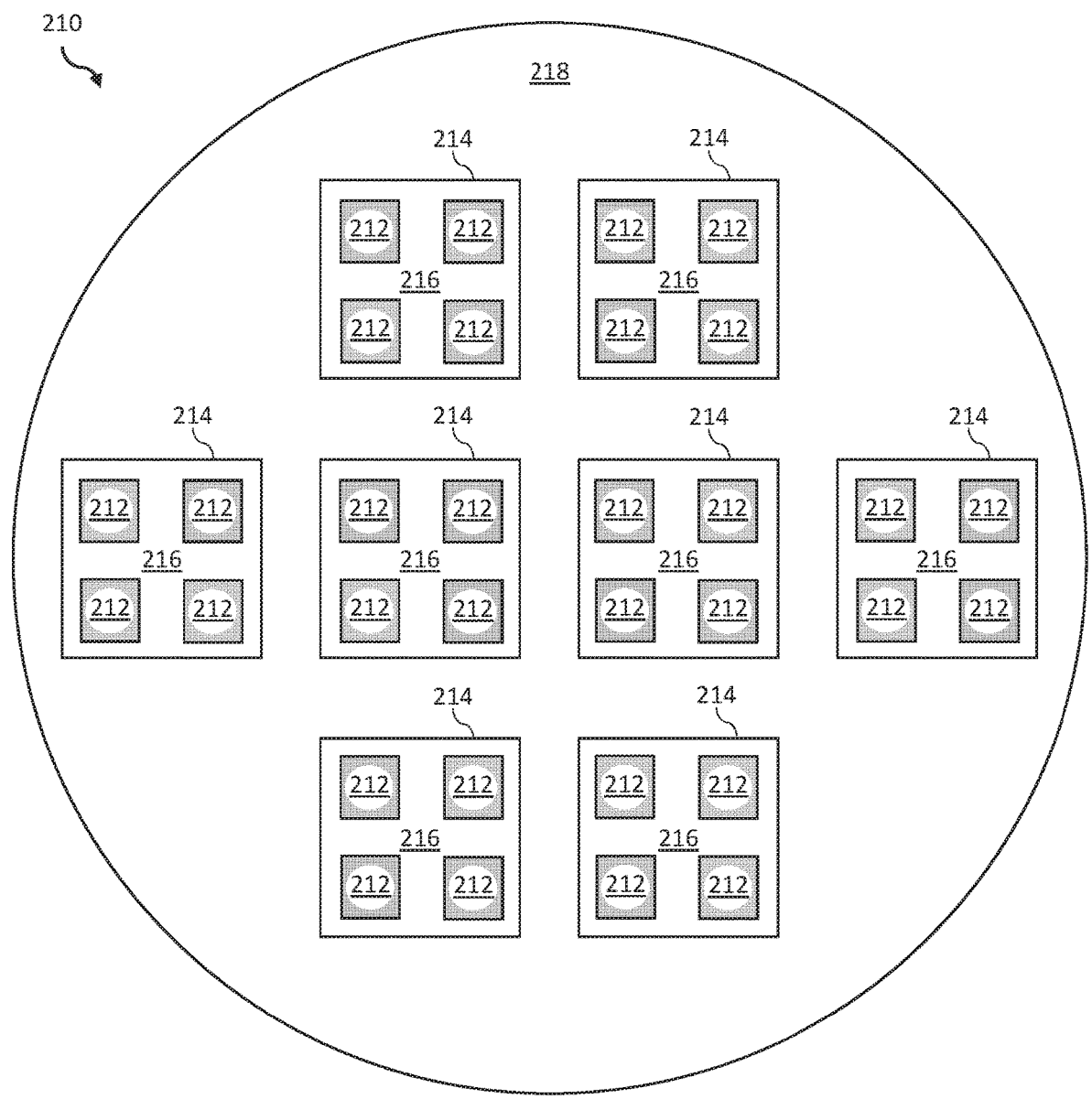
FIG. 2a is a plan view of a photomask for a semiconductor, according to an embodiment of the present invention.

Referring to step S110, described in conjunction with FIG. 2a, a photomask 210 is designed, photomask 210, defining a design for deposition layer 212 for interconnect layers in a semiconductor chip 214. Photomask 210 design may contain white space 216, i.e. areas of no design, in between and around the circuit designs for the transitions and interconnect layers for semiconductor each chip 214. Photomask 210 may also contain a kerf 218, i.e., white space in between the one or more semiconductor chip 214 designs where the semiconductor chips 214 of a single wafer are cut apart. It may be appreciated that each semiconductor chip 214 is designed using multiple different photomasks 210, each photomask 210 defining circuit structures in a deposition layer 212, which are layered on top of one another.

Figure 2B:
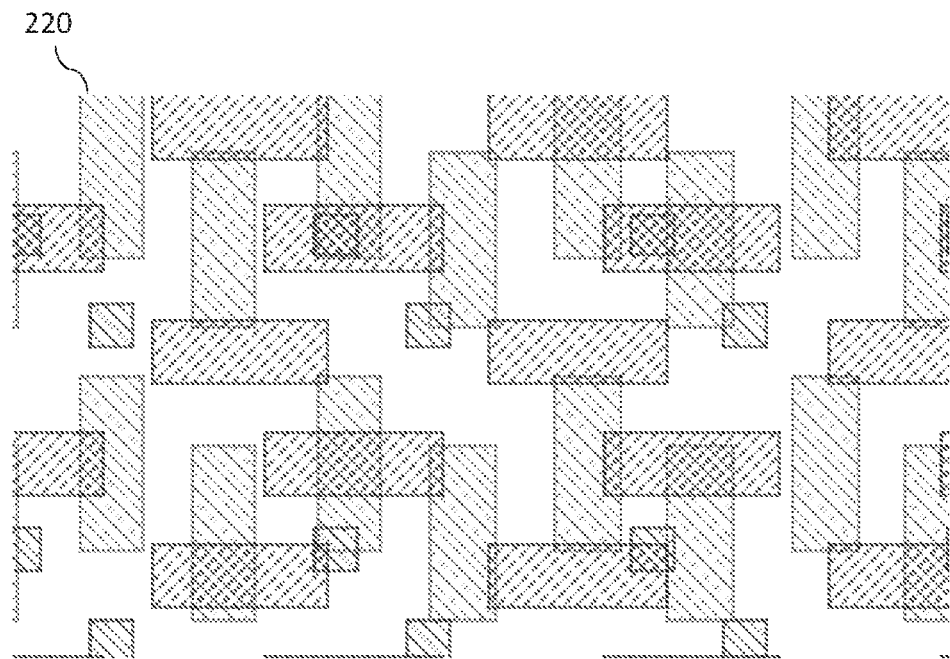
FIG. 2b illustrates an example optical fingerprint design, according to an embodiment of the present invention.
Figure 2C:
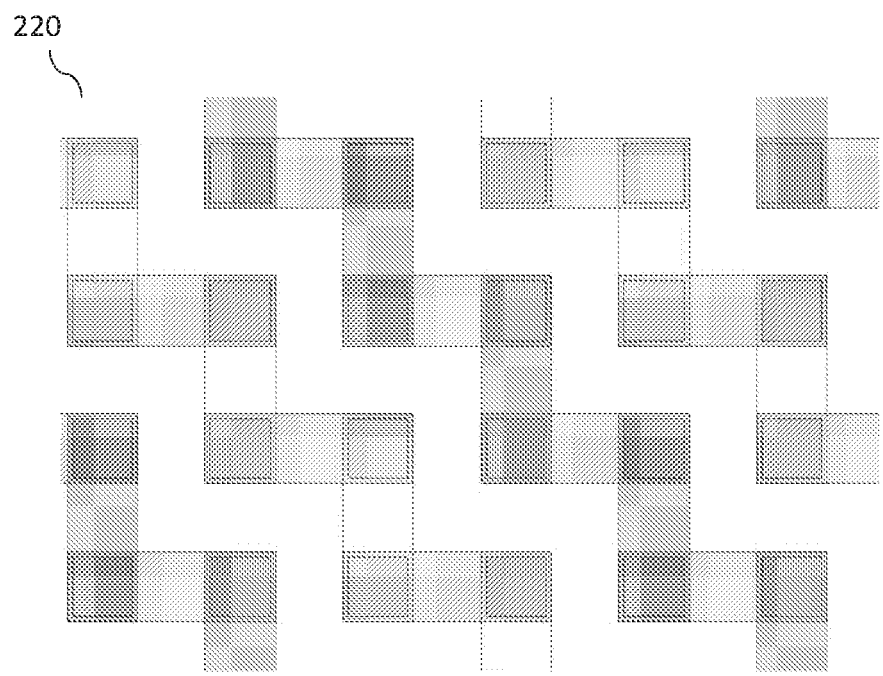
FIG. 2c illustrates an example optical fingerprint design, according to an embodiment of the present invention.

Referring to step S112, described in conjunction with FIGS. 2b-c, a fingerprint algorithm is run to design an optical fingerprint 220 to fit within the available white space 216 of the design for semiconductor chips 214 on photomask 210. For example, the fingerprint algorithm may analyze the white space 216 of the design of objects to be printed, the sizes of the designed objects to be printed and the critical aspects of the designed objects to be printed for semiconductor chips 214 on photomask 210 and calculate an optical design to fit within white space 216. The fingerprint algorithm may analyze all photomasks 210 that will be used to manufacture semiconductor chip 214 to create optical fingerprint 220. The fingerprint algorithm may account for the overlay and placement of the generated fill structures of the design of optical fingerprint 220 between layers of optical fingerprint 220 to ensure that they are able to be tested and/or visually assessed during and post-manufacturing for validity against the inserted fill. For example, optical fingerprint 220 as illustrated in FIGS. 2b-c shows an optical fingerprint design for multiple photomasks 210 layered on top of one another, i.e. designs for subsequent deposition layers 212. In an embodiment of the invention, the fingerprint algorithm may intentionally omit certain overlay/contact points between layers in optical fingerprint 220. For example, the fingerprint algorithm may use, but is not limited to, a covershape approach to determine the regularity and placement of intentionally omitted shapes within the circuit design of optical fingerprint 220. The covershape definitions may be restricted to the fill definition and fingerprint algorithm and may not be shared with the subsequent manufacturing steps, and thus remain protected which may allow the unique covershape designs to be optically recognized.

Optical fingerprint 220 may be a design for trenches to be etched into the deposition layer 212 of semiconductor chip 214. In another embodiment of the invention, the optical fingerprint 220 may also be designed to fit within kerf 218 on photomask 210 between the designs for semiconductor chips 214.

Figure 2D:
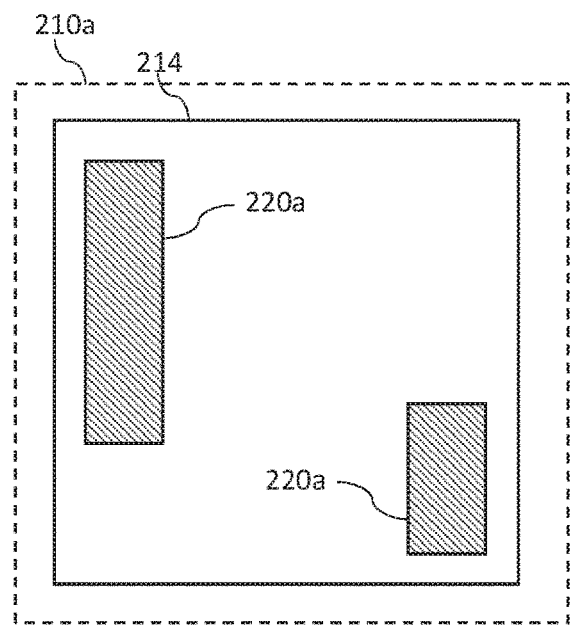
FIG. 2d is plan view of a semiconductor design for a first deposition layer with an optical fingerprint, according to an embodiment of the present invention.
Figure 2E:
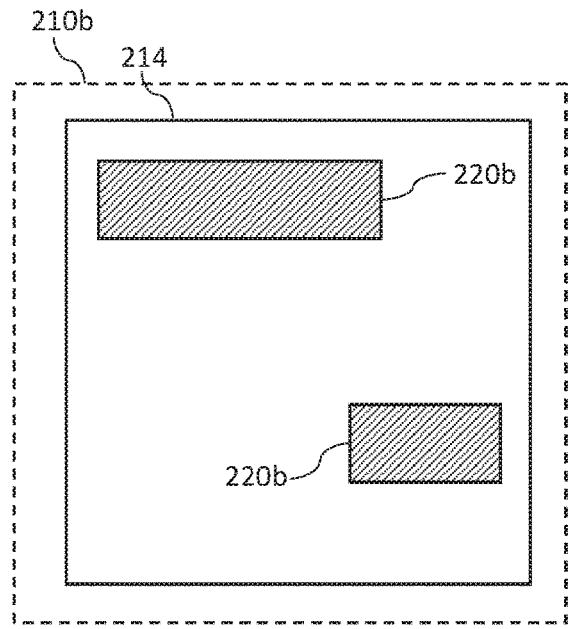
FIG. 2e is plan view of a semiconductor design for a second deposition layer with an optical fingerprint, according to an embodiment of the present invention.
Figure 2F:
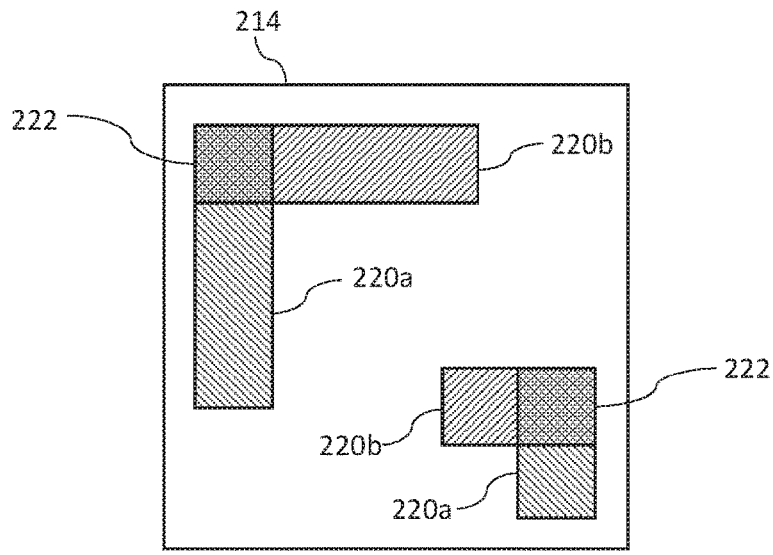
FIG. 2f is plan view of a semiconductor design for a first and second deposition layer with an optical fingerprint, according to an embodiment of the present invention.

Referring to step S114, described in conjunction with FIGS. 2d-f, the optical fingerprint 220 is inserted in the white space 216 of the photomask 210 design. FIG. 2d illustrates a first photomask 210a corresponding to a first deposition layer of semiconductor chip 214 with a first optical fingerprint 220a. FIG. 2e illustrates a second photomask 210b corresponding to a second deposition layer of semiconductor chip 214 with a second optical fingerprint 220b. FIG. 2f illustrates semiconductor chip 214 with the designs for first deposition layer with optical fingerprint 220a and second deposition layer with optical fingerprint 220b with overlap area 222. It can be appreciated that semiconductor chip 214 may consist of many deposition layers 212, with each deposition layer 212 having a unique design and optical fingerprint 220. Further, it can be appreciated that semiconductor chip 214 with deposition layers 212 with optical fingerprint 220 may have multiple overlap areas 222 Overlap areas 222 may have unique pattern that can be viewed using a light source or a microscope such as, but not limited to a Moiré pattern.

Referring to step S116, the photomask design containing the semiconductor circuit design and the design for optical fingerprint 220 may be optionally enhanced using optical proximity correction. Optical proximity correction is a photolithography enhancement technique used to compensate for image errors due to diffraction or process effects.

Referring to step S118, a photomask is built according to the photomask design to include optical fingerprint 220, and a wafer is fabricated using the photomask at step S120. The trenches to be etched into the deposition layer 212 of semiconductor chip 214 may contain metal and/or silicon depending on deposition layer 212. For example, semiconductor fabrication consists of several stages including, Front-End-Of-The-Line (FEOL), Middle-Of-The-Line (MOL), and Back-End-Of-The-Line (BEOL) processes. For deposition layers 212 created in FEOL processes, the trenches may be filled with a either silicon, such as, but not limited to Poly Silicon, or Amorphous Silicon, or a metal, such as, but not limited to, copper, aluminum, or tungsten. For deposition layers 212 created in MOL or BEOL processes, the trenches may be filled with a metal, such as, but not limited to, copper, aluminum, or tungsten. In an embodiment of the invention, steps S110-S120 may be repeated until all deposition layers 212 of semiconductor chip 214 are completed.

Referring to step S122, the wafer is optically analyzed to confirm the correct photomask design was used. For example, the trenches of the different deposition layers 212 of optical fingerprint 220 design may have a unique overlap pattern. For example, overlap areas 222x may form Moiré patterns. The wafer may be analyzed using a light source, such as, but not limited to, an ultraviolet (UV) light source to illuminate semiconductor chip 214. In an embodiment of the invention, the wafer may be analyzed using a microscope. The wafer may be optically analyzed after each deposition layer 212 has been deposited. In an embodiment of the invention, the wafer may be analyzed after two or more deposition layers 212 of semiconductor chip 214 have been deposited.

Referring to step S124, the optical patterns of the wafer are compared to the known optical patterns of optical fingerprint 220. When the optical patterns of the wafer match the known optical patterns of optical fingerprint 220, the wafer is validated at step S126. When the optical patterns of the wafer do not match the known optical patterns of optical fingerprint 220, the wafer is discarded at step S128. In an embodiment of the invention, the wafer may be compared to known covershape designs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein. It is therefore intended that the present invention not be limited to the exact forms and details described and illustrated but fall within the scope of the appended claims.

What is claimed is:

1. A semiconductor chip comprising:
   electrical circuits necessary for the operation of the semiconductor chip;
   a white space between adjacent electrical circuits of the semiconductor chip, the white space has no electrical circuits; and
   multiple deposition layers each having a unique pattern of fill structures located between adjacent electrical circuits of the semiconductor chip.

2. The semiconductor chip according to claim 1, wherein at least a portion of one of the unique pattern of fill structures overlaps at least a portion of another of the unique pattern of fill structures in a different deposition layer.

3. The semiconductor chip according to claim 1, wherein the unique pattern of fill structures are viewable using a light source.

4. The semiconductor chip according to claim 1, wherein the unique pattern of fill structures are viewable using a microscope.

5. The semiconductor chip according to claim 1, wherein the multiple deposition layers include deposition layers in the Front-End-Of-The-Line, deposition layers in the Middle-Of-The-Line and deposition layers in the Back-End-Of-The-Line.

6. The semiconductor chip according to claim 1, wherein the multiple deposition layers include deposition layers in the Front-End-Of-The-Line with fill structures comprising silicon or metal.

7. The semiconductor chip according to claim 1, wherein the multiple deposition layers include deposition layers in the Middle-Of-The-Line and deposition layers in the Back-End-Of-The-Line with fill structures comprising metal.

8. A semiconductor chip comprising:
   a first area comprising electrical circuits necessary for the operation of the semiconductor chip;
   a second area void of any electrical circuits; and
   an unique pattern in the second area of the semiconductor chip, the unique pattern comprises an arrangement of multiple fill structures in each of a plurality of deposition layers of the semiconductor chip.

9. The semiconductor chip according to claim 8, wherein at least a portion of one of the arrangement of multiple fill structures overlaps at least a portion of another of the arrangement of multiple fill structures in a different deposition layer.

10. The semiconductor chip according to claim 8, wherein the unique pattern is viewable using a light source.

11. The semiconductor chip according to claim 8, wherein the unique pattern is viewable using a microscope.

12. The semiconductor chip according to claim 8, wherein the plurality of deposition layers include deposition layers in the Front-End-Of-The-Line, deposition layers in the Middle-Of-The-Line and deposition layers in the Back-End-Of-The-Line.

13. The semiconductor chip according to claim 8, wherein the plurality of deposition layers include deposition layers in the Front-End-Of-The-Line with fill structures comprising silicon or metal.

14. The semiconductor chip according to claim 8, wherein the plurality of deposition layers include deposition layers in the Middle-Of-The-Line and deposition layers in the Back-End-Of-The-Line with fill structures comprise metal.

15. A semiconductor chip comprising:
   electrical circuits necessary for the operation of the semiconductor chip;
   multiple deposition layers each having a fingerprint located between adjacent electrical circuits of the semiconductor chip, each of the fingerprints comprise multiple fill structures arranged in a unique pattern.

16. The semiconductor chip according to claim 15, wherein at least a portion of one of the fingerprints overlaps at least a portion of another of the fingerprints in a different deposition layer.

17. The semiconductor chip according to claim 15, wherein the fingerprints are viewable using a light source or a microscope.

18. The semiconductor chip according to claim 15, wherein the multiple deposition layers include deposition layers in the Front-End-Of-The-Line, deposition layers in the Middle-Of-The-Line and deposition layers in the Back-End-Of-The-Line.

19. The semiconductor chip according to claim 15, wherein the multiple deposition layers include deposition layers in the Front-End-Of-The-Line, deposition layers in the Middle-Of-The-Line and deposition layers in the Back-End-Of-The-Line, the fill structures in the deposition layers in the Front-End-Of-The-Line comprise silicon or metal, and the fill structures in the deposition layers in the Middle-Of-The-Line and in the Back-End-Of-The-Line comprise metal.

20. The semiconductor chip according to claim 15, wherein the fingerprints together comprises a Moiré pattern.

* * * * *